United States Patent
Yamakage

(10) Patent No.: US 10,935,963 B2
(45) Date of Patent: Mar. 2, 2021

(54) REQUIRED ACCURACY SETTING DEVICE

(71) Applicant: FUJI CORPORATION, Chiryu (JP)

(72) Inventor: Yusuke Yamakage, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/755,748

(22) PCT Filed: Sep. 1, 2015

(86) PCT No.: PCT/JP2015/074838
§ 371 (c)(1),
(2) Date: Feb. 27, 2018

(87) PCT Pub. No.: WO2017/037865
PCT Pub. Date: Mar. 9, 2017

(65) Prior Publication Data
US 2018/0284732 A1    Oct. 4, 2018

(51) Int. Cl.
| | | |
|---|---|---|
| *G05B 19/418* | (2006.01) | |
| *H05K 13/04* | (2006.01) | |
| *H05K 13/08* | (2006.01) | |
| *H05K 13/02* | (2006.01) | |

(52) U.S. Cl.
CPC ......... *G05B 19/4184* (2013.01); *H05K 13/02* (2013.01); *H05K 13/04* (2013.01); *H05K 13/0404* (2013.01); *H05K 13/0452* (2013.01); *H05K 13/0853* (2018.08); *H05K 13/0882* (2018.08); *G05B 2219/37605* (2013.01);
(Continued)

(58) Field of Classification Search
CPC .................................................. H05K 13/0853
USPC .................................................. 700/100, 112
See application file for complete search history.

(56) References Cited

U.S. PATENT DOCUMENTS

| | | | |
|---|---|---|---|
| 2002/0069525 A1* | 6/2002 | Hada .................. | H05K 13/0853 29/834 |
| 2004/0148764 A1 | 8/2004 | Hada et al. | |
| 2004/0148768 A1 | 8/2004 | Hada et al. | |
| (Continued) | | | |

FOREIGN PATENT DOCUMENTS

| | | |
|---|---|---|
| CN | 101310977 A | 11/2008 |
| EP | 1 189 497 A2 | 3/2002 |
| (Continued) | | |

OTHER PUBLICATIONS

International Search Report dated Dec. 8, 2015, in PCT/JP2015/074838 filed Sep. 1, 2015.
(Continued)

*Primary Examiner* — Emilio J Saavedra
(74) *Attorney, Agent, or Firm* — Oblon, McClelland, Maier & Neustadt, L.L.P.

(57) ABSTRACT

A CPU of a management computer sets an nth component in a mounting operation order of the current sequence as a target component, calculates nearby state data of the target component, sets the required accuracy of the target component based on the nearby state data and memorizes the required accuracy of HDD. Because the required accuracy is automatically set based on the nearby state data in this manner, the set required accuracy matches actual circumstances better compared to than with conventional technology. Therefore, it is possible to automatically set appropriate required accuracy of a target component.

7 Claims, 6 Drawing Sheets

(52) U.S. Cl.
CPC .............. *G05B 2219/45026* (2013.01); *G05B 2219/45031* (2013.01)

(56) References Cited

U.S. PATENT DOCUMENTS

| | | | |
|---|---|---|---|
| 2010/0152877 A1* | 6/2010 | Maenishi | H05K 13/0413 700/108 |
| 2015/0273634 A1* | 10/2015 | Tombs | H05K 3/3468 228/102 |
| 2015/0289426 A1* | 10/2015 | Mantani | H05K 13/0465 228/9 |

FOREIGN PATENT DOCUMENTS

| | | |
|---|---|---|
| EP | 1 876 879 A2 | 1/2008 |
| JP | 4-328900 A | 11/1992 |
| JP | 2771814 B2 | 7/1998 |
| JP | 5675487 B2 | 2/2015 |

OTHER PUBLICATIONS

Extended European Search Report dated Jul. 25, 2018 in Patent Application No. 15902985.9, 8 pages.

* cited by examiner

| Sequence | | | | | |
|---|---|---|---|---|---|
| Mounting order | Component related data | | | | |
| | Part type | Part size | Mounting position | Bump diameter | Nozzle type |
| 1 | ... | ... | ... | ... | ... |
| 2 | ... | ... | ... | ... | ... |
| 3 | ... | ... | ... | ... | ... |
| 4 | ... | ... | ... | ... | ... |

| Sequence | | | | | | |
|---|---|---|---|---|---|---|
| Mounting order | Component related data | | | | | Required accuracy |
| | Part type | Part size | Mounting position | Bump diameter | Nozzle type | |
| 1 | ... | ... | ... | ... | ... | 60 μm |
| 2 | ... | ... | ... | ... | ... | 60 μm |
| 3 | ... | ... | ... | ... | ... | 40 μm |
| 4 | ... | ... | ... | ... | ... | 20 μm |

REQUIRED ACCURACY SETTING DEVICE

TECHNICAL FIELD

The present disclosure relates to a required accuracy setting device.

BACKGROUND ART

Conventionally, there are known component mounters that use a pickup section to pick up a component supplied by a component supply unit, transport the component above a board, and mount the component at a specified mounting position on the board. For example, disclosed in patent literature 1 is a component mounter of this type that determines required accuracy according to factors such as type of process, type and size of component, and the like, and controls positioning waiting time of the head, and moving speed and moving acceleration of the head for movement during processing, based on the determined required accuracy.

CITATION LIST

Patent Literature

Patent literature 1: JP-A-H4-328900

SUMMARY

However, with patent literature 1, the magnitude of the required accuracy is determined without considering the state of surroundings of the component that is being mounted on the board. Therefore, for example, when mounting certain components on a board, it is not possible to change the required accuracy based on whether there is already another component mounted near the mounting position of the component to be mounted, or whether there is not another component mounted near the mounting position of the component. Thus, in some cases the required accuracy does not suit the circumstances.

The present disclosure takes account of such circumstances, and an object thereof is to automatically set an appropriate required accuracy for a target component to be mounted on a board.

A required accuracy setting device of the present disclosure is for setting a required accuracy that is required when using a pickup section to pick up a component supplied by a component supply unit, and mount the component at a specified mounting position on a board, wherein
the required accuracy setting device is configured to set the required accuracy for at least picking up a target component from the component supply unit or mounting the target component at the mounting position based on nearby state data related to a state of a portion near to the mounting position of the target component that is to be mounted on the board.

With this required accuracy setting device, a required accuracy for at least picking up a target component from the component supply unit or mounting the target component at the mounting position is automatically set based on nearby state data related to a state of a portion near to the mounting position of the target component that is to be mounted on the board. Because the required accuracy is automatically set based on the nearby state data in this manner, the set required accuracy matches actual circumstances better compared to than with conventional technology. Therefore, it is possible to automatically set appropriate required accuracy of a target component.

With a required accuracy setting device of the present disclosure, the nearby state data may include data related to a component spacing distance that is a distance between the target component and a nearby component that has been mounted or that is to be mounted nearby the target component, and the required accuracy may be set to be more accurate the smaller the component spacing distance is. In this case, if the component spacing distance is small, the required accuracy will be set to a high accuracy, therefore, when mounting the target component, interference will be unlikely to occur between the target component and nearby components.

With a required accuracy setting device of the present disclosure, the nearby state data may include data representing a positional relationship between a component holding member of the pickup section used when mounting the target component at the mounting position, and a nearby component that has been mounted or that is to be mounted nearby the target component, and the required accuracy may be set to be more accurate the closer the positional relationship between the component holding member and the nearby component is. In this case, if the shape and size of the component holding member used to mount the target component means that the relationship between the component holding member and nearby components is likely to result in interference, the required accuracy is set to a high accuracy, therefore, when mounting the target component, interference will be unlikely to occur between the component holding member and nearby components.

With a required accuracy setting device of the present disclosure, the nearby state data may include data related to a printing state of solder printed at the specified mounting position before the target component is mounted at the specified mounting position on the board, and the required accuracy may be set to be more accurate the larger a deviation is of the printed solder with respect to the mounting position. Accordingly, if the deviation of the printed solder is large, the permissible range when mounting the target component at the specified mounting position is smaller, however, because the required accuracy is set to a high accuracy, it is more likely that the target component will be mounted within the permissible range.

With a required accuracy setting device of the present disclosure, the required accuracy may be set based on, in addition to the nearby state data, data related to a position deviation trend of the target component based on experience, and the required accuracy may be set to be more accurate the higher the position deviation trend is. Accordingly, if the position deviation trend of the target component based on experience is high, because the required accuracy is set to a high accuracy, positional deviation of the target component to be mounted is less likely to occur.

DESCRIPTION OF EMBODIMENTS

Figure 1:
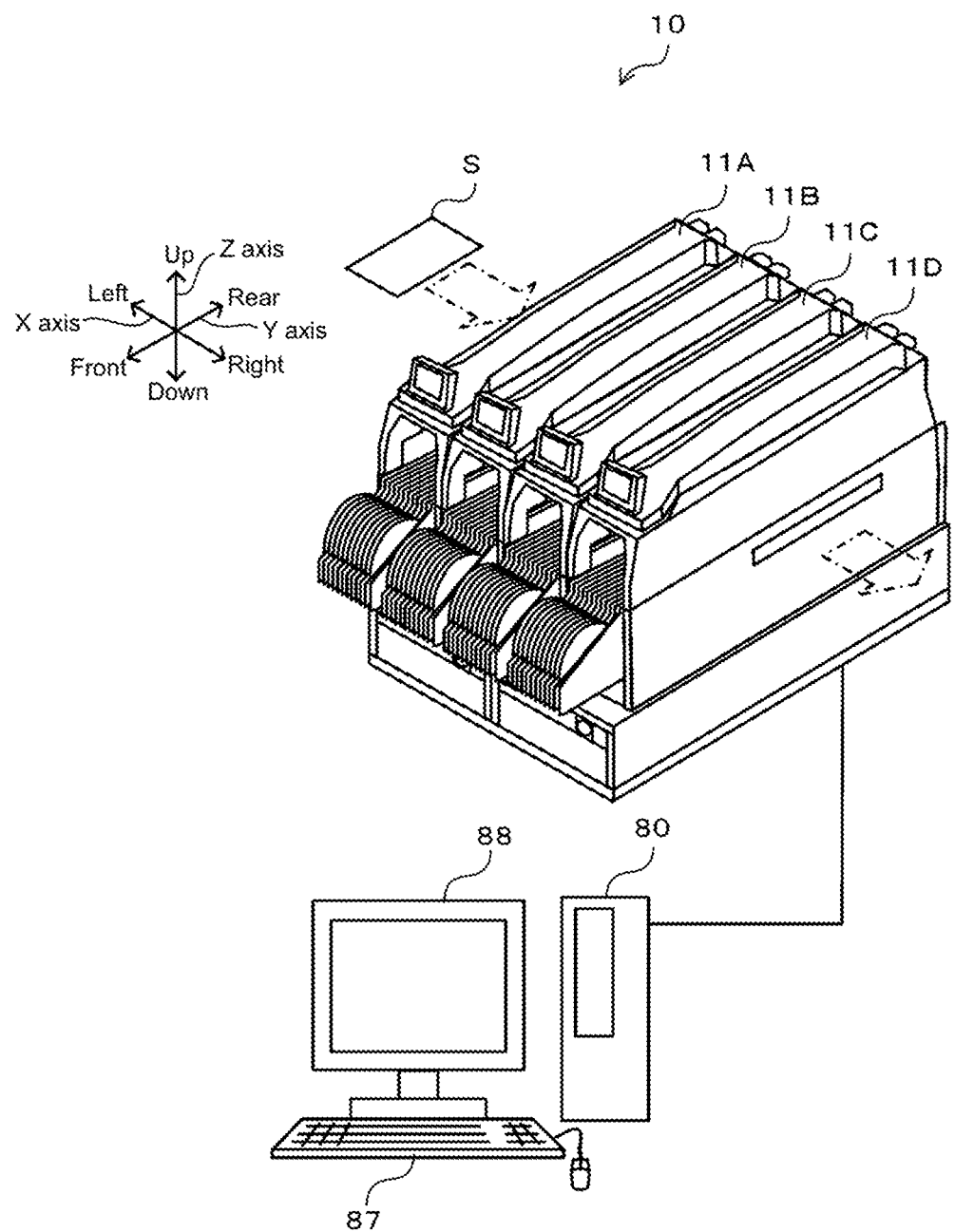
FIG. 1 shows an outline of the configuration of component mounting line 10.
Figure 2:
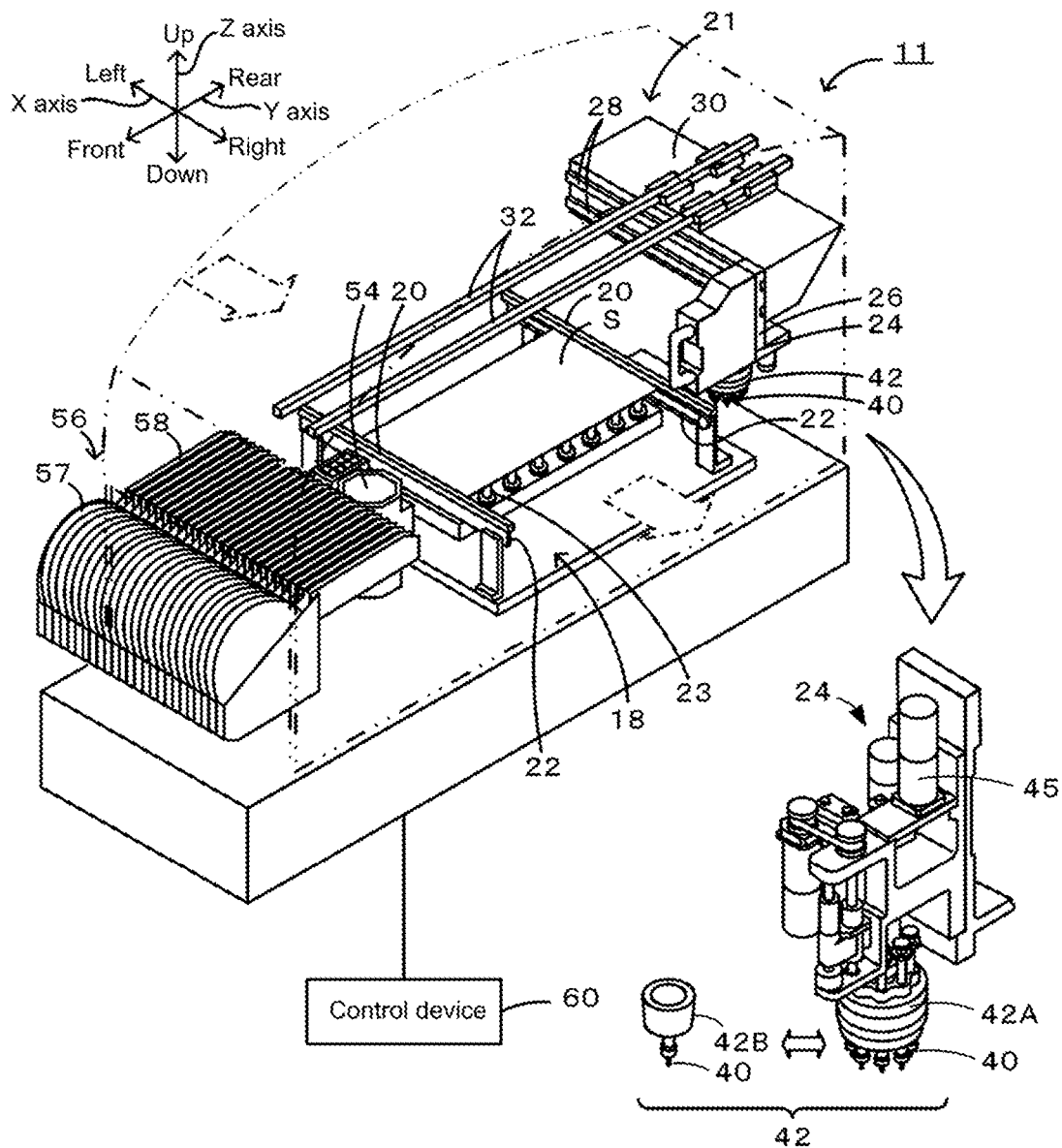
FIG. 2 shows an outline of the configuration of mounter 11.

A suitable embodiment of the present disclosure is described below with reference to the figures. FIG. 1 shows an outline of the configuration of component mounting line 10, and FIG. 2 shows an outline of the configuration of mounter 11. For the present embodiment, in FIGS. 1 and 2, the left/right direction is the X-axis direction, the front/rear direction is the Y-axis direction, and the up/down direction is the Z-axis direction.

Component mounting line 10 is provided with multiple mounters 11A to 11D that perform processing of mounting components on board S, and management computer 80 that performs overall production management of the entire system such as management of each mounter 11A to 11D. Because each mounter 11A to 11D has substantially the same configuration, unless there is a particular need, they are collectively referred to as mounter 11.

As shown in FIG. 2, mounter 11 is provided with conveyance section 18 that conveys board S, pickup section 21 that picks up components, reel unit 56 that supplies components, and control device 60 that performs overall device control. Conveyance section 18 is provided with support plates 20 and 20 arranged with a gap between them in the front-rear direction of FIG. 2 and extending in the left-right direction, and conveyor belts 22 and 22 provided on surfaces of both supporting plates 20 and 20 that face each other. Conveyor belts 22 and 22 are endlessly supported on drive wheels and driven wheels provided on the left and right of support plates 20 and 20. Board S is placed on the top surfaces of the pair of conveyor belts 22 and 22 and is conveyed from left to right. Board S is supported from underneath by many support pins 23.

Pickup section 21 is provided with items such as mounting head 24, X-axis slider 26, and Y-axis slider 30. Mounting head 24 is attached to a front surface of X-axis slider 26. X-axis slider 26 is attached to the front surface of Y-axis slider 30, which is slidable in the front-rear direction, so as to be slidable in the left-right direction. Y-axis slider 30 is slidably attached to a pair of guide rails 32 and 32 that extend in the front-rear direction. Note that, guide rails 32 and 32 are fixed to an internal section of mounter 11. Guide rails 28 and 28 that extend in the left-right direction are provided on the front surface of Y-axis slider 30, and X-axis slider 26 is attached to these guide rails 28 and 28 so as to be slidable in the left-right direction. Mounting head 24 moves in the left and right directions based on the moving in the left and right directions of X-axis slider 26, and moves in the front and rear directions based on the moving in the front and rear directions of Y-axis slider 30. Note that, each slider 26 and 30 is driven by a drive motor, which are not shown.

Mounting head 24 is provided with exchangeable auto-tool 42A or 428 that include at least one nozzle 40 that picks up a component. Note that, when it is not necessary to distinguish between auto-tools 42A and 42B, they are collectively referred to as auto-tool 42. Auto-tool 42A is provided with twelve nozzles 40. Auto-tool 42B is provided with one nozzle 40. With auto-tool 42A, the configuration is such that nozzle 40 slides directly inside a sleeve that extends vertically, while with auto-tool 42B, the configuration is such that nozzle 40 slides in a state supported by a bearing. Therefore, compared to nozzle 40 of auto-tool 42A, nozzle 40 of auto-tool 42B slides up and down more smoothly, and therefore has better operation accuracy. Also, auto-tool 42A includes a mechanism for revolving nozzles 40 by rotating a cylindrical body of auto-tool 42A and a mechanism for rotating nozzles 40 on their own axes, whereas auto-tool 42B includes a mechanism for rotating nozzle 40 on its own axis by rotating a cylindrical body. Thus, because auto-tool 42B has fewer moving sections, the play is smaller compared to auto-tool 42A, thus operation accuracy is better. Nozzle 40 uses pressure to pick up and release a component at the nozzle tip. Nozzle 40 is raised/lowered in the Z-axis direction (up/down direction), which is perpendicular to the X-axis and Y-axis directions, by a holder raising/lowering device that has Z-axis motor 45 as a drive source. Note that, the component holding member that holds and releases a component is described here as nozzle 40 that picks up and releases a component by suction and canceling the suction, but the configuration is not limited to this, for example, the component holding member may be a mechanical chuck.

Reel unit 56 is provided with multiple reels 57 around which is wound tape housing components, with reel unit 56 being removably attached to a front side of mounter 11. The tape is unwound from reel 57 and is fed by feeder section 58 to a pickup position at which pickup is performed by mounting head 24. Component camera 54 is arranged in front of support plate 20 on the front side of conveyance section 18. The imaging range of component camera 54 is above component camera 54. When nozzle 40 holding a component passes above component camera 54, component camera 54 images the state of the component held by nozzle 40 and outputs the image to control device 60.

Figures 3, 4:
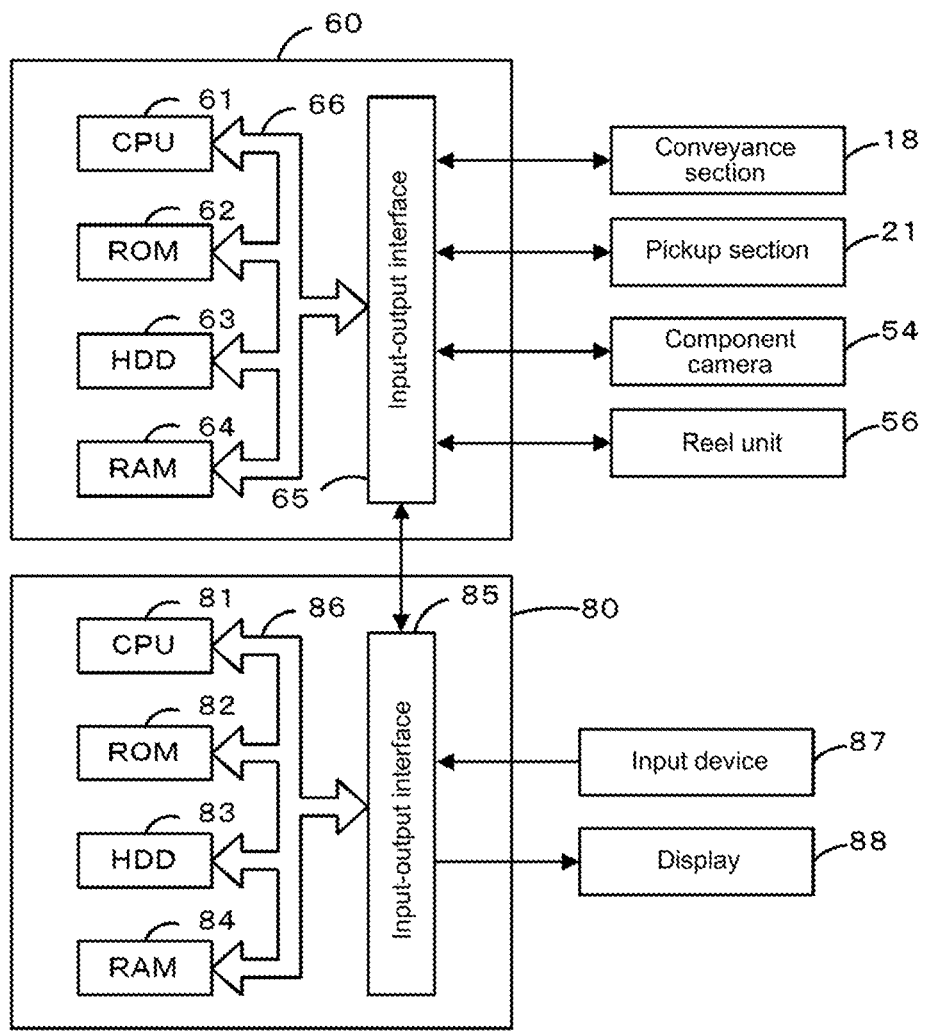
FIG. 3 is a block diagram showing electrical connections of control device 60 and management computer 80.
FIG. 4 shows an example of a sequence.

As shown in FIG. 3, control device 60 is configured from a microprocessor based around CPU 61, ROM 62 that memorizes a processing program, HDD 63 that memorizes various data, RAM 64 used as working memory, input-output interface 65 for performing communication of electric signals with external devices, and so on, and these are connected by bus 66. Control device 60 is connected to items such as conveyance section 18, pickup section 21, component camera 54, and reel unit 56 such that two-way communication is possible. Each slider 26 and 30 is provided with position sensors, which are not shown, and control device 60 controls drive motors of sliders 26 and 30 while receiving position information from the position sensors.

As shown in FIG. 3, management computer 80 is provided with items such as a microprocessor centered around CPU 81, ROM 82 that memorizes a processing program, HDD 83 that memorizes various information, RAM 84 used as working memory, and input-output interface 85 for performing two-way communication with control devices 60 of each mounter 11, and these are connected by bus 86. Management computer 80 is connected to be capable of receiving input of signals from input device 87 such as a mouse or a keyboard and of outputting various images to display 88 via input-output interface 85.

Next, operation of the embodiment of component mounting line 10 configured as above is described. As shown in FIG. 1, all the components that are planned to be mounted on one board S are mounted on the board S by performing successive mounting of components at the four mounters 11A to 11D that configure component mounting line 10. That is, all the components are mounted on the board S between when it is loaded inside component mounting line 10 at the loading window on the left side and when it is unloaded from the unloading window on the right side. Here, component mounting sequences are set for each of the mounters 11, in this case four, with the sequences being memorized on HDD 83 of management computer 80. An example sequence is shown in FIG. 4. Component related data (component type, component size, mounting position on board S, bump diameter, nozzle type, and so on) is linked to each mounting operation in the sequence. CPU 81 of management computer 80 sets the required accuracy for each mounting operation of the sequence, and the sequence is allocated to a mounter that has a specified accuracy capable of achieving the set required accuracy.

Figure 5:
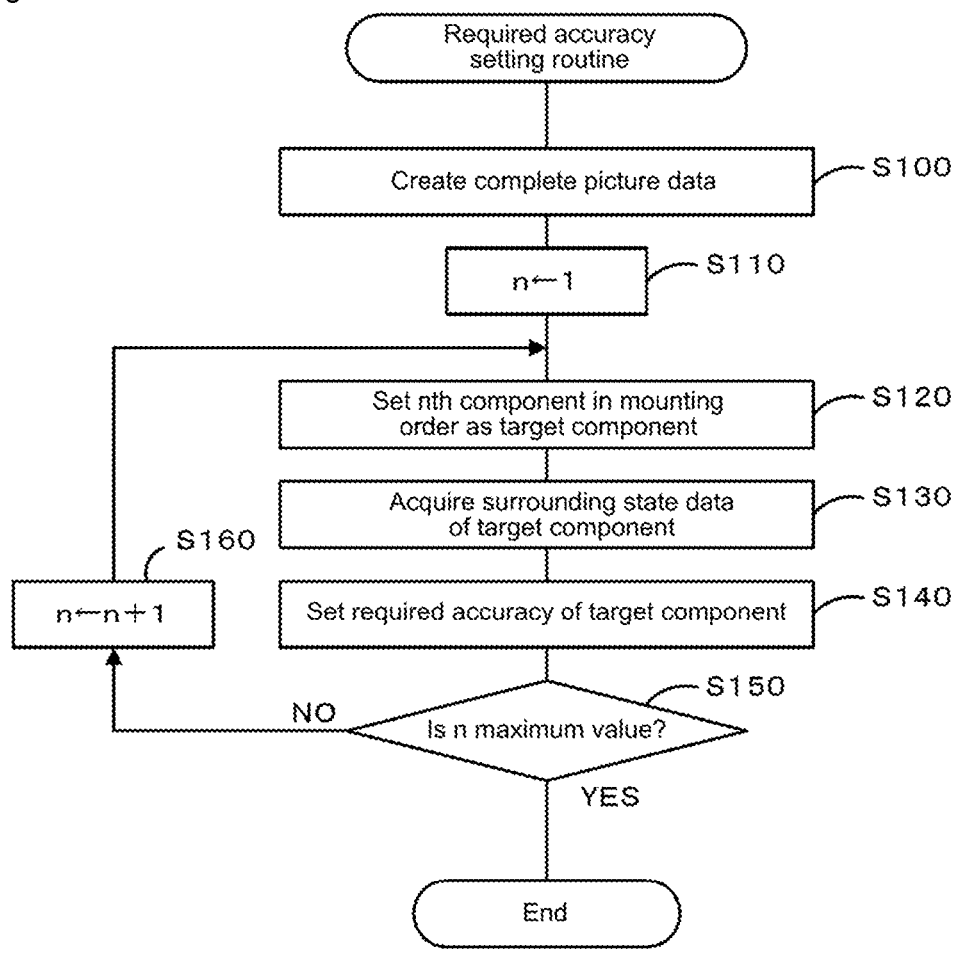
FIG. 5 is a flowchart showing an example of a required accuracy setting routine.

First, the required accuracy setting routine performed by CPU 81 of management computer 80 is described. FIG. 5 is a flowchart showing an example of a required accuracy setting routine. This routine is memorized on HDD 83 of management computer 80 and is performed for each sequence.

CPU 81 of management computer 80, when the required accuracy setting routine is started, first, creates complete picture data according to the current sequence (step S100). Complete picture data is data representing which components are arranged at which positions on the board when mounting is performed according to the sequence. As shown in FIG. 5, component related data linked to mounting operations of the sequence includes items such as component type, component size, component mounting position (center coordinates), bump diameter, and type of nozzle used. CPU 81 calculates the mounting region of the component from the component size and component mounting positions (center coordinates) from the component related data, and arranges the mounting region of each component in the XY plane in accordance with the mounting operation order. The mounting regions are regions in the XY plane occupied by a component when that component is correctly mounted at the mounting position. By this, complete picture data is created of the situation when all components are mounted on the board according to the current sequence.

Figure 6:
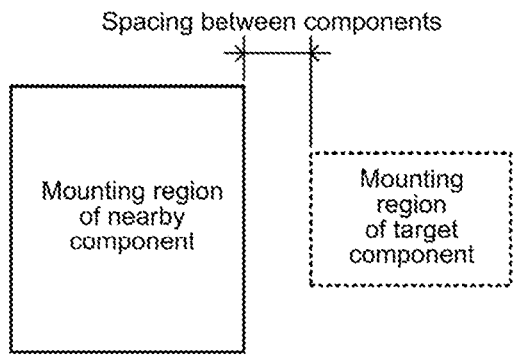
FIG. 6 illustrates an example of a component spacing distance.
Figures 7, 8:
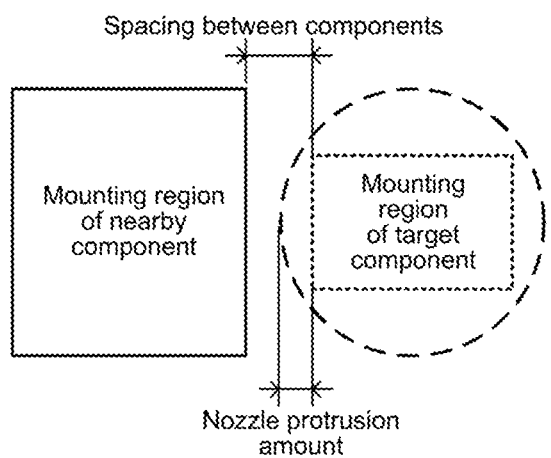
FIG. 7 illustrates an example of a nozzle protrusion amount.
FIG. 8 shows an example of data of a sequence after completing setting of the required accuracy.

Next, CPU 81 assigns a value of one to variable (step S110), and sets the nth component in the mounting operation order of the current sequence as the target component (step S120). Next, CPU 81 calculates (acquires) nearby state data of the target component (step S130), sets the required accuracy of the target component based on the nearby state data, and memorizes the set required accuracy in HDD 83 (step S140). For example, as shown in FIG. 6, in the complete picture data, in a case in which there is already a nearby component present before the target component is mounted, CPU 81 calculates the component spacing distance, that is, the distance between the mounting region of the nearby component and the mounting region of the target component, as nearby state data, and sets the required accuracy of the target component based on the component spacing distance. The required accuracy is a value representing an allowable tolerance with respect to the mounting regions in question, for example, values such as 20 μm, 40 μm, or 60 μm. The smaller the value, the higher the required accuracy. For example, if the component spacing distance is 40 μm, CPU 81 sets the required accuracy of the target component to 40 μm. On the other hand, if the component spacing distance is 20 μm, CPU 81 sets the required accuracy of the target component to 20 μm. In this manner, the smaller the component spacing distance between the target component and the nearby component, the higher the required accuracy of the target component is set. Note that, in reality, when setting the required accuracy of the target component, because the required accuracy set for nearby components is also considered, in many cases the required accuracy of the target component will be set to a value smaller than the component spacing distance. Also, as shown in FIG. 7, in a case in which the size of the nozzle type used to mount the target component is larger than the size of the target component such that the nozzle protrudes outside the area of the component, CPU 81 also calculates data representing the positional relationship between nearby components and the nozzle 50 when mounting the target component at the mounting position (nozzle protrusion amount) as nearby state data, and sets the required accuracy of the target component also considering the nozzle protrusion amount. For example, in a case in which the component spacing distance is 40 μm, CPU 81 sets the required accuracy of the target component to less than 40 μm (for example, 30 μm or 20 μm).

Next, CPU 81 determines whether variable n is a maximum value, that is, the value of the last mounting operation of the current sequence (step S150), and if variable n is not the maximum value, adds one to variable n (step S160), and performs processing from step S120 again. On the other hand, if variable n is the maximum value in step S150, setting of the required accuracy is complete for all the components from the first to the last of the mounting operations of the current sequence, so CPU 81 ends the routine. An example of sequence data after completing the setting of the required accuracies is shown in FIG. 8. As illustrated in FIG. 8, with the present embodiment, the required accuracy of the target components is the accuracy required for each mounting operation.

Figure 9:
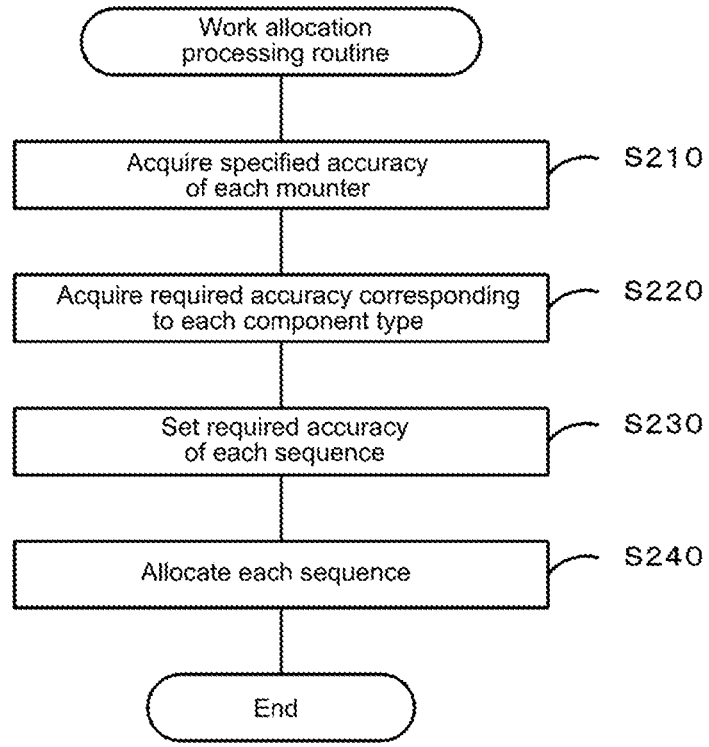
FIG. 9 is a flowchart showing an example of a work allocation processing routine.

Described next is the work allocation processing routine performed by CPU 81 of management computer 80. FIG. 9 is a flowchart showing an example of a work allocation processing routine. This routine is memorized on HDD 83 of management computer 80 and is performed based on a start command from an operator. CPU 81 of management computer 80, when the work allocation processing routine is started, first, acquires the specified accuracy of each mounter 11A to 11D (step S210). The specified accuracy is determined by both the accuracy of the mounter 11 itself and the accuracy of the auto-tool 42 loaded on the mounting head 24 of the mounter 11. The specified accuracy of mounters 11A to 11D may be acquired by CPU 81 of management computer 80 communicating with control device 60 of each mounter 11A to 11D, or may be acquired by reading information memorized in advanced on HDD 83 of management computer 80. Next, CPU 81, for each sequence, acquires the required accuracy set for the components included in the sequence (step S220), and sets the required accuracy of the sequence (step S230). Specifically, CPU 81, for a given sequence, sets the required accuracy for that sequence to the highest required accuracy among the required accuracies set for each mounting operation included in the sequence. Next, CPU 81 performs allocation of each sequence (step S240), and ends the routine. Specifically, CPU 81, when allocating a given sequence, allocates the sequence to a mounter 11 with a specified accuracy that satisfies the required accuracy of that sequence.

Described next are operations of mounter 11, in particular, operations of using nozzle 40 to pick up a component supplied by reel unit 56 and mount the component at a specified position on board S. First, CPU 61 of control device 60 picks up components using nozzles 40 of auto-tool 42 in accordance with the allocated sequence. In a case of auto-tool 42A that includes twelve nozzles 40, components of the first to twelfth mounting operations are picked up in order by nozzles 40 as auto-tool 42A is intermittently rotated. On the other hand, in a case of auto-tool 42B that includes one nozzle 40, the component of the first mounting operation is picked up by the nozzle 40. Next, CPU 61 controls X-axis and Y-axis sliders 26 and 30 of pickup section 21 to move mounting head 24 above component camera 54, and then images the components held by nozzles 40 using component camera 54. In a case of auto-tool 42A with twelve nozzles 40, the components held on all the nozzles 40 are imaged while intermittently rotating auto-tool 42A. On the other hand, in a case of auto-tool 42B with one nozzle 40, the component held by the single nozzle 40 is simply imaged. CPU 61 determines the orientation of the component by analyzing the captured image. Next, CPU 61 controls X-axis and Y-axis sliders 26 and 30 of pickup section 21 to move mounting head 24 above board S, and mounts the component held by nozzle 40 on board S. In a case of auto-tool 42A with twelve nozzles 40, components of the first to twelfth mounting operations are mounted in order at the mounting positions on board S as auto-tool 42A is intermittently rotated. On the other hand, in a case of auto-tool 42B with one nozzle 40, the single component is simply mounted at the mounting position on the board. CPU 61 repeatedly performs this work in accordance with the allocated sequences until all the planned components have been mounted on board S, and then unloads the board S for which work is complete to a downstream mounter 11.

Correspondences between constituent elements of the present embodiment and constituent elements of the disclosure will be clarified here. Management computer 80 of the present embodiment corresponds to the required accuracy setting device of the present disclosure, reel unit 56 corresponds to the component supply unit, and nozzle 40 corresponds to the component holding member of the pickup section.

With management computer 80 of an embodiment above, a required accuracy for mounting a target component at a mounting position is automatically set based on nearby state data related to a state of a portion near to the mounting position of the target component that is to be mounted on a board S. Because the required accuracy is automatically set based on the nearby state data in this manner, the set required accuracy matches actual circumstances better compared to than with conventional technology. Therefore, it is possible to automatically set appropriate required accuracy of a target component.

Also, management computer 80, when setting the required accuracy, sets the required accuracy of the target component to a higher accuracy the smaller the component spacing distance between nearby components and the target component, therefore, when mounting the target component, interference will be unlikely to occur between the target component and nearby components.

Further, management computer 80, when setting the required accuracy, also considers the nozzle protrusion amount in addition to the component spacing distance. That is, the closer the positional relationship between the nearby component and the nozzle 40 used to mount the target component at the mounting position, the higher the required accuracy of the target component is set. For example, when the positional relationship between the nearby component and the nozzle 40 used to mount the target component at the mounting position is such that interference with a nearby component is more likely, the required accuracy of the target component is set to a higher accuracy. Therefore, nozzle 40 is less likely to interfere with a nearby component when mounting the target component.

Meanwhile, it goes without saying that the disclosure is not limited to the above-mentioned embodiment and various embodiments may be applied within the technical scope of the disclosure.

For example, in the required accuracy setting routine of an embodiment above (refer to FIG. 5), required accuracies are set with mounting operations in a predetermined state, however, required accuracies may be set with mounting operations not in a predetermined state. In this case, for example, a table may be prepared linking component mounting positions and component types for each component from the first component to the last component to be mounted on a single board S. Numbers may be allocated simply in order. Then, in step S120, CPU 81 of management computer 80 may set a component with a number n in the table as the target component. Also, in steps S130 and S140, CPU 81 may calculate the spacing (component spacing distance) between the mounting region of the target component and the mounting region of nearby components to be mounted near to the target component, and set the required accuracy of the target component based on the component spacing distance. Then, after completing setting the required accuracies for all the components, CPU 81 may allocate components to a mounter 11 with a specified accuracy that satisfies the required accuracy of the component based on the required accuracy set for the component and the specified accuracy of the mounter 11. Then, control device 60 of each mounter 11 may determine the mounting operation order such that the allocated components are mounted in the optimum order. In this manner too, similar effects as the above embodiment are achieved.

With an embodiment above, the required accuracy that is required when mounting the target component at the mounting position is set, but in addition to or instead of this, the required accuracy that is required when the nozzle 40 of pickup section 21 picks up the target component from reel unit 56 may be set. For example, in a case in which the component spacing distance between a nearby component and the target component is small, if the deviation when the nozzle 40 picks up the target component is large, the protrusion amount that the nozzle 40 protrudes from the target component will be large, causing interference between the target component and a nearby component. Considering preventing this interference, it is desirable to set the required accuracy during pickup too. Note that, in a case in which the required for a component is different for pickup and mounting, pickup work of the component may be performed using the required accuracy for pickup, and mounting work may be performed using the required accuracy for mounting.

Figure 10:
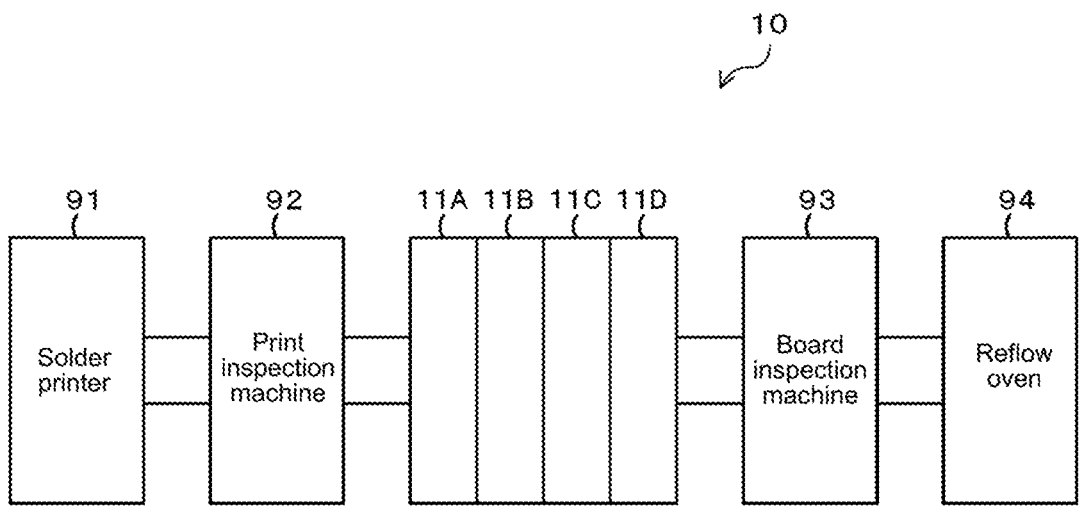
FIG. 10 shows the schematic configuration of component mounting line 10 of an alternative embodiment.

In component mounting line 10 of an embodiment above, as shown in FIG. 10, solder printer 91 and print inspection machine 92 may be provided at an upstream side of mounters 11A to 11D, and board inspection machine 93 and reflow oven 94 may be provided at a downstream side of mounters 11A to 11D. Solder printer 91 screen prints solder on board S. Print inspection machine 92 inspects the state of the solder printed on board S using image processing. Board inspection machine 93 inspects the state of components mounted on the printer solder using image processing. Reflow oven 94 melts the solder by heating board S such that each component is attached to the board S by solder. With the configuration shown in FIG. 10, the required accuracy of target components may be set to be higher the larger the deviation of the printed solder from the mounting position. A specific example of this is described below. In solder printer 91, solder is printed at predetermined positions for each mounting position of each component (for example, positions corresponding to the electrodes [such as bumps] of the component). If inspection results from print inspection machine 92 indicate that the deviation of solder printing by solder printer 91 is within a specified range, CPU 81 sets the required accuracy of components to be loaded on that solder to a normal level. In this case, if the required accuracy is a normal level, this is not detrimental to the electrical connection between the solder and the electrodes of the component. In a case in which the deviation of the printed solder exceeds the specified range, the permissible range for the deviation of the electrodes of the component mounted on the solder becomes narrower. In this case, CPU 81 sets the required accuracy of the component to be mounted on the solder higher than the normal level. This makes it more likely that the target component will be mounted within the permissible range. Here, the required accuracy may be increased in stages in accordance with the size of the deviation in the printed solder. However, if the deviation of the printed solder exceeds the specified range by so much that the deviation is in a defect range, because this is likely to be detrimental to the electrical connection between the solder and the electrodes of the component, CPU 81 may treat that board S as defective and have it removed from the line.

In component mounting line 10 of FIG. 10, in a case in which inspection results of board inspection machine 93 indicate that the deviation for all components is within the permissible range, CPU 81 does not change the required accuracy for each component to be mounted on the next board S to be loaded to component mounting line 10. However, CPU 81, in a case in which the frequency of boards S for which the deviation of a specific component exceeds the permissible range exceeds a specified quantity (for example, quantity k or greater among ten boards [where k is a natural number]), it is determined that the position deviation trend for that component is high, and the required accuracy for when mounting that component to the next board S to be loaded to component mounting line 10 may be set to a higher level. In this manner, in a case in which the position deviation trend of a specific component based on experience is high, because the required accuracy is set to a high accuracy, subsequently position deviation of that component will be less likely to occur. Note that, the required accuracy may be increased in stages in accordance with the level of frequency of boards S for which the deviation of a specific component exceeds the permissible range.

In an embodiment above, mounter 11 may have multiple work modes with different accuracies, and may perform component mounting processing with a work mode suitable for the required accuracy of each component. For example, as work modes, mounter 11 may select one from a high accuracy mode (20 μm mode), a medium accuracy mode (40 μm mode), and a low accuracy mode (60 μm mode). Mounter 11, in high accuracy mode, performs control such that the moving speed of mounting head 24 is slow, and such that the matching width between a position control target value and a measurement value stays within a narrow range. Accordingly, component mounting time increases, but highly accurate component mounting is performed. On the other hand, with low accuracy mode, control is performed such that the moving speed of mounting head 24 is fast, such that the matching width between a position control target value and a measurement value stays within a wide range. Accordingly, the accuracy of component mounting is not high, but component mounting time is shorter, and throughput is improved. With medium speed mode, the moving speed and matching width are between those of the high accuracy mode and the low accuracy mode. Further, as components are mounted consecutively, the work mode that suits the required accuracies of the components may be used. Accordingly, mounting work of components is allocated such that the abilities of mounter 11 that includes multiple work modes are sufficiently exploited.

In an embodiment above, management computer 80 is described as an example of a required accuracy setting device of the present disclosure, but the configuration is not limited to this, for example, a computer may be provided separately to management computer 80 for setting the required accuracy. Alternatively, control device 60 of mounter 11 may function as the required accuracy setting device.

INDUSTRIAL APPLICABILITY

The present disclosure may be applied to an item such as a computer that manages a mounter that uses a pickup section to mount components supplied from a component supply unit at specified mounting positions on a board.

REFERENCE SIGNS LIST

10: component mounting line; 11, 11A to 11D: mounter; 18: conveyance section; 20: support plate; 21: pickup section; 22: conveyor belt; 23: support pin; 24: mounting head; 26: X-axis slider; 28: guide rail; 30: Y-axis slider; 32: guide rail; 40: nozzle; 42, 42A, 42B: auto-tool; 45: Z-axis motor; 54: component camera; 56: reel unit; 57: reel; 58: feeder section; 60: control device; 61: CPU; 62: ROM; 63: HDD; 64: RAM; 65: input-output interface; 66: bus; 80: management computer; 81: CPU; 82: ROM; 83: HDD; 84: RAM; 85: input-output interface; 86: bus; 87: input device; 88: display; 91: solder printer; 92: print inspection machine; 93: board inspection machine; 94: reflow oven

The invention claimed is:

1. A required accuracy setting device for setting a required accuracy that is required when using a pickup section to pick up components supplied by a component supply unit, and mount the components at respective specified mounting positions on a board in a sequence, the required accuracy setting device comprising:
circuitry configured to
create complete picture data representing the components at the respective specified mounting positions on the board according to the sequence, the creating complete picture data including, for each component, calculating a mounting region of the component based on a size of the component and the component mounting position, and arranging the mounting region in accordance with a mounting operation order of the sequence,
for each component in the mounting operating order of the sequence:
calculate nearby state data related to a state of a portion near to the mounting position of a target component that is to be mounted on the board based on the complete picture data, and
set the required accuracy for at least picking up the target component from the component supply unit or mounting the target component at the mounting position based on the nearby state data, provide sequence data that includes the required accuracy for each mounting operation of the sequence, and select a work mode for a mounter from multiple work modes with different accuracies to perform component mounting with a work mode based on the required accuracy, in which the accuracy of a first work mode is a smaller value than the accuracy of a second work mode, and a moving speed of a mounting head of the mounter of the first work anode is slower than a moving speed of the mounting head of the mounter of the second work mode, wherein the required accuracy is a value representing an allowable tolerance with respect to the mounting region, wherein the nearby state data includes data related to a printing state of solder printed at the specified mounting position before the target component is mounted at the specified mounting position on the board, and wherein the allowable tolerance is set to be smaller the larger a deviation is of the printed solder with respect to the mounting position.

2. The required accuracy setting device according to claim 1, wherein the nearby state data includes data related to a component spacing distance that is a distance between the target component and a nearby component that has been mounted or that is to be mounted nearby the target component, and the required accuracy is set to be more accurate the smaller the component spacing distance is.

3. The required accuracy setting device according to claim 1, wherein the nearby state data includes data representing a positional relationship between a component holding member of the pickup section used when mounting the target component at the mounting position, and a nearby component that has been mounted or that is to be mounted nearby the target component, and the required accuracy is set to be more accurate the closer the positional relationship between the component holding member and the nearby component is.

4. The required accuracy setting device according to claim 1, wherein the required accuracy is set based on, in addition to the nearby state data, data related to a position deviation trend of the target component, and the required accuracy is set to be more accurate the higher the position deviation trend is.

5. A required accuracy setting device for setting a required accuracy that is required when using a pickup section to pick up components supplied by a component supply unit, and mount the components at respective specified mounting positions on a board in a sequence, the required accuracy setting device comprising:

circuitry configured to set the required accuracy for at least picking up a target component from the component supply unit or mounting the target component at the mounting position based on nearby state data related to a state of a portion near to the mounting position of the target component that is to be mounted on the board, and select a work mode for a mounter from multiple work modes with different accuracies to perform component mounting with a work mode based on the required accuracy, in which the accuracy of a first work mode is a smaller value than the accuracy of a second work mode, and a moving speed of a mounting head of the mounter of the first work mode is slower than a moving speed of the mounting head of the mounter of the second work mode, wherein the required accuracy is a value representing an allowable tolerance with respect to the mounting region, wherein the nearby state data includes data related to a printing state of solder printed at the specified mounting position before the target component is mounted at the specified mounting position on the board, and wherein the allowable tolerance is set to be smaller the larger a deviation is of the printed solder with respect to the mounting position.

6. A required accuracy setting device for setting a required accuracy that is required when using a pickup section to pick up components supplied by a component supply unit, and mount the components at respective specified mounting positions on a board in a sequence, the required accuracy setting device comprising:

circuitry configured to set the required accuracy for at least picking up a target component from the component supply unit or mounting the target component at the mounting position based on nearby state data related to a state of a portion near to the mounting position of the target component that is to be mounted on the board, and select a work mode for a mounter from multiple work modes with different accuracies to perform component mounting with a work mode based on the required accuracy, in which the accuracy of a first work mode is a smaller value than the accuracy of a second work mode, and a moving speed of a mounting head of the mounter of the first work mode is slower than a moving speed of the mounting head of the mounter of the second work mode, wherein the required accuracy is a value representing an allowable tolerance with respect to the mounting region.

7. A required accuracy setting device for setting a required accuracy that is required when using a pickup section to pick up components supplied by a component supply unit, and mount the components at respective specified mounting positions on a board in a sequence, the required accuracy setting device comprising:

circuitry configured to set the required accuracy for at least picking up a target component from the component supply unit or mounting the target component at the mounting position based on nearby state data related to a state of a portion near to the mounting position of the target component that is to be mounted on the board, and select a work mode for a mounter from multiple work modes with different accuracies to perform component mounting with a work mode based on the required accuracy, in which the accuracy of a first work mode is a smaller value than the accuracy of a second work mode, and component mounting time of a mounting head of the mounter of the first work mode is longer than component mounting time of the mounting head of the mounter of the second work mode, wherein the required accuracy is a value representing an allowable tolerance with respect to the mounting region.

* * * * *